United States Patent [19]

Byun

[11] Patent Number: 5,413,957
[45] Date of Patent: May 9, 1995

[54] METHOD FOR FABRICATING MOS TRANSISTOR HAVING SOURCE/DRAIN REGION OF SHALLOW JUNCTION AND SILICIDE FILM

[75] Inventor: Jeong S. Byun, Chungcheongbuk-do, Rep. of Korea

[73] Assignee: Goldstar Electron Co., Ltd., Rep. of Korea

[21] Appl. No.: 185,553

[22] Filed: Jan. 24, 1994

[51] Int. Cl.$^6$ .......................................... H01L 21/225
[52] U.S. Cl. ................................. 437/161; 437/950; 437/913
[58] Field of Search .............. 437/161, 950, 192, 200, 437/913, 40; 148/DIG. 144

[56] References Cited

U.S. PATENT DOCUMENTS

| | | | |
|---|---|---|---|
| 5,084,417 | 1/1992 | Joshi et al. | 437/200 |
| 5,162,262 | 11/1992 | Ajika et al. | 437/190 |
| 5,223,081 | 6/1993 | Doan | 437/200 |
| 5,268,317 | 12/1993 | Schwalke et al. | 437/950 |

OTHER PUBLICATIONS

Wolf, Silicon Processing Brochure VLSI Era 128, 132–133, ©1990 Lattice Press.
Article entitled "High Temperature Process Limitation on TiSi$_2$" by C. Y. Ting, F. M. D'Heurle, S. S. Iyer, and P. M. Fryer, published Dec. 1986 in *J. Electrochem. Soc.: Solid–State Science and Technology*, vol. 133, No. 12.
Article entitled "The Process Window of A–Si/Ti Bilayer Metallization for an Oxidation–Resistant and Self-Aligned TiSi$_2$ Process" by Y. S. Lou, C. Y. Wu, and H. C. Cheng, published Aug. 1992 in *IEEE Transactions on Electron Devices*, vol. 39, No. 8.
Paper entitled "Collimated Sputtering of TiN/Ti Liners into Sub–Half Micron High Aspect Ratio Contacts/Lines" by R. V. Joshi and S. Brodsky, Presented Jun. 9–10, 1992 at the VMIC Conference.
Paper entitled "Ultra Shallow Junction Formation Using Diffusion From Silicides: I. Silicide Formation, Dopant Implantation and Depth Profiling" by H. Jiang, C. M. Osburn, P. Smith, Z. G. Xiao, D. Griffis, G. McGuire, and G. A. Rozgonyi, published Jan. 1992 in *J. Electrochem. Soc.*, vol. 139, No. 1.

*Primary Examiner*—Olik Chaudhuri
*Assistant Examiner*—S. Mulpuri
*Attorney, Agent, or Firm*—Poms, Smith, Lande & Rose

[57] ABSTRACT

A method for fabricating an MOS transistor having a source/drain region of shallow junction and a thin silicide film is disclosed.

The present method taking advantage of the phase separation of a titanium nitride is capable of forming a thin silicide film in one metal heat treatment process and thus, simplifying the processes as compared with conventional methods employing two heat treatments. In addition, the consumption of a source/drain region is minimized, so that a titanium silicide film suitable to shallow junction can be obtained, preventive of the increase of contact resistance. Further, the improvement of device characteristic are also attributed to the lack of metal bridge, which results from the function of the phase separation phenomenon preventing the formation of the metal bridge in spite of the heat treatment of high temperature. Furthermore, since the source/drain region is formed at an acceleration energy of not less than 30 KeV by employing a common ion-implanting apparatus, the present invention has significant advantages over the conventional methods, including the parasitic resistance such as the area resistance of the junction and the device characteristics.

9 Claims, 7 Drawing Sheets

F I G.5a
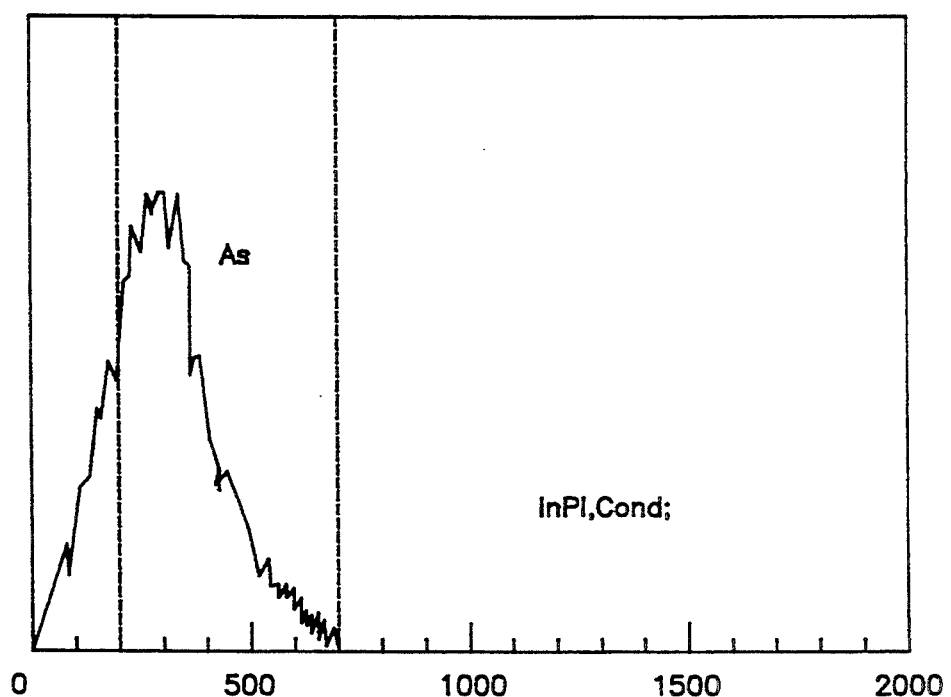
F I G.5b
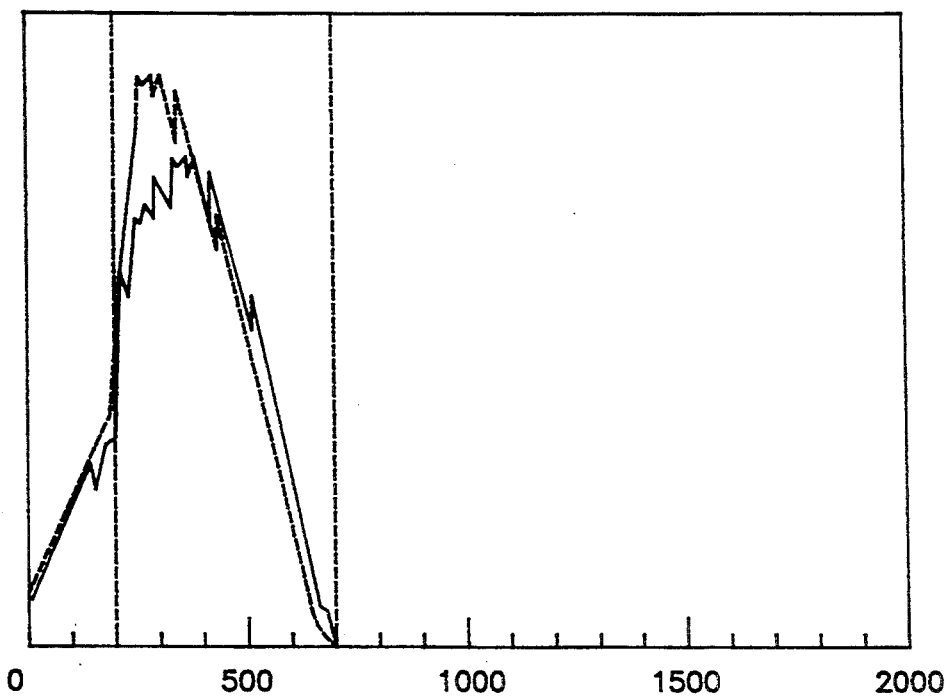

METHOD FOR FABRICATING MOS TRANSISTOR HAVING SOURCE/DRAIN REGION OF SHALLOW JUNCTION AND SILICIDE FILM

BACKGROUND OF THE INVENTION

The present invention relates, in general, to a method for fabricating an MOS transistor and, more particularly, to a method for fabricating a MOS transistor, capable of forming a thin silicide film with once heat treatment and forming a source/drain region of shallow junction by use of a common ion-impalnting apparatus.

As the integration technology for semiconductor has been developed in the last few years, MOS transistors of not more than several microns can be integrated. As a result of high integration, the size of MOS transistor becomes smaller and the junction depth of source/drain region in the MOS transistor comes to be more shallow.

However, since the area resistance of a junction is inversely proportional to the depth of the junction, as the depth of the source/drain region becomes shallower, the area resistance of the junction is larger, increasing the parasitic resistance of a device.

In an effort to reduce the parasitic resistance and to improve the characteristics of the device in fabricating a very highly integrated circuit, a silicide film has been proposed to be formed on the source/drain region.

The area resistance of junction is proportional to a specific resistance and is inversely proportional to the depth of junction. While the specific resistance of silicon is about 200 $\mu\Omega$.cm, that of the silicide film is around 50 $\mu\Omega$.cm even though a little difference is caused by its composition materials. Accordingly, taking advantage of the small specific resistance of the silicide, the area resistance of the shallow junction, a parasitic resistance, can be reduced.

As such a silicide film, a titanium silicide film is widely known to those skilled in the art.

Since the formation of titanium silicide film in a source/drain region results from the reaction of titanium with a silicon substrate constituting the junction as shown in the following formula, the formation of silicide film causes the source/drain region of silicon to consume in the amount corresponding to the thickness of the silicide film formed:

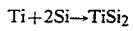

$$Ti + 2Si \rightarrow TiSi_2$$

Accordingly, because the thickness of the silicide film formed, that is the consumed portion of the source/drain region is considered as a part of the depth of the junction, there have been demanded a technology for the formation of thin, stable silicide film. In addition, the method is required to give electrical uniformity to the interface between the silicon and the silicide film formed in the source/drain region of shallow junction.

Silicide are largely grouped into a polycide, which is formed by the reaction of polysilicon with a refractory metal and into a self-aligned silicide (hereinafter "SALICIDE"), which results from the reaction of silicon with refractory metals.

Description for conventional fabrication processes for MOS transistor is to be given with reference to some figures for better understanding of the background of the present invention.

Referring initially to FIGS. 1A through 1E, there are illustrated conventional processes for fabricating a MOS transistor having a source/drain region of shallow junction on which a silicide film formed.

First, as shown in FIG. 1A, a conventional double diffusion process is applied to a substrate 11, so as to form a low density source/drain region 15 and a high density source/drain region 17. For this, so-called LOCOS process is carried out to form a field oxide film 12 which sections the substrate 11 into an active channel region and a device separation region and then, a gate insulating film 13 and a gate of polysilicon film 14 are formed on a predetermined portion of the channel region, in due order. The low density source/drain region 15 is formed by taking advantage of the gate 14 as a mask in implanting impurities having an opposite, conductive type from the substrate 11. On the other hand, the high density source/drain region 17 is formed adjacent to the low density source/drain region 15 by taking advantage of the gate 14 and a pair of spacers 16 formed at both side walls of the gate 14 as a mask in implanting an opposite, conductive type from the substrate 11.

FIGS. 1B and 1C illustrate the formation of a titanium silicide (TiSi) film. As illustrated in these figures, a titanium film 18, which is a kind of a refractory film, is thinly deposited on the entire surface of the resulting structure of FIG. 1A and then, is subjected to a primary heat treatment process at about 700° C. During this primary heat treatment, silicon atoms move to the thin titanium film 18. That is, the reaction of the silicon atoms with the titanium occurs at the interface between the silicon substrate 11 and the thin titanium film 18 and the interface between the gate 14 of polysilicon and the thin titanium film 18, so as to form titanium silicide films 19 and 20 having a $C_{49}$ phase.

Next, as shown in FIG. 1D, all non-reacted, remaining titanium film 18 is removed with a $NH_4OH/H_2O_2$ solution. As mentioned above, the titanium silicide film 19 formed on the source/drain region 17 belongs to the SALICIDE, whereas the titanium silicide film 20 formed on the gate 14 has the property of polycide.

Finally, a secondary heat treatment is applied at a temperature of not less than 800° C., so as to form titanium silicide films 19′ and 20′ having a $C_{54}$ phase, as shown in FIG. 1E. As a result, a MOS transistor is fabricated, wherein the thin titanium silicide film 19′ is formed on the source/drain region 17 of shallow junction.

The reason that the above heat treatments are separately carried out is as follows: if the thin titanium film formed is subjected to a metal heat treatment process at a high temperature, the silicon atoms move into the thin titanium film 18 and crosses over the spacers 16, so that not only is formed the titanium silicide film 19′ of $C_{54}$ phase on the source/drain region and the gate 14 but also unnecessary metal bridges 21 are formed across on the spacers 16. Since the metal bridges 21 are conductive, there is caused a short.

Therefore, the primary heat treatment is carried out at a low temperature to form the titanium silicide film 19 of $C_{49}$ only on the source/drain region 17 and then, non-reacted titanium film is removed so completely as not to form the metal bridges when the secondary heat treatment process is performed at a high temperature to form the titanium silicide film 19′ of $C_{54}$ phase.

In the titanium silicide film, there are present two polymorphies. One is a titanium silicide of $C_{49}$ (orthorhombic) structure, wherein lattice constant is a=3.62 Å, b=13.76 Å and c=3.605 Å. On the other hand, the other has a $C_{54}$ (orthorhombic) structure, wherein lattice constant is a=8.236 Å, b=4.773 Å and c=8.523 Å.

In the fabrication of semiconductor device, TiSi of $C_{54}$ structure is employed owing to its stability and lower specific resistance.

To form the titanium silicide film on the source/drain region, as mentioned above, the source/drain region must be consumed a little because the thickness of the silicide film formed, that is, consumed portion of the region is included in the junction depth of the source/drain region.

Since the contact resistance is generally increased as the thickness of the silicide film is increased, it is preferred to form the silicide film in the thickness of not more than 300 Å.

For the sake of forming the thin silicide film, the titanium film is to be thinly deposited in a previous process. However, since the thin titanium film and the thin silicide film are inferior in thermal stability, agglomeration occurs in the sequential, secondary heat treatment process, lowering the device characteristic.

In addition, owing to the thermal instability caused by the thin thickness of the titanium silicide film formed by the conventional processes, there are extensively generated bends at the interface between the titanium silicide film 19' and the source/drain region 17 of silicon.

Among methods for forming a thin silicide film on a source/drain region of shallow junction, a method using silicide as diffusion source, that is, SADS method has known to be most useful.

SADS method has been reported in J. electrochem. Sec., 139, 196, 1992. This SADS method comprises forming previously a silicide film on a silicon substrate, implanting dopant ions in the silicide film and applying a heat treatment process to the silicide film to diffuse the dopants in the silicide into the silicon substrate, thereby forming a source/drain of shallow junction. In process order, this method is different from the method illustrated in FIG. 1 in which a source/drain region is formed in advance of the formation of a silicide film.

With reference to FIGS. 3A through 3G, there are shown conventional fabrication processes for MOS transistor, using SADS process.

As shown in FIG. 3A, so-called LOCOS process is carried out to form a field oxide film 32 which sections a substrate 31 into an active channel region and a device separation region and then, a gate insulating film 33 and a gate of polysilicon film 34 are formed on a predetermined portion of the channel region, in due order. Subsequently, a pair of spacers 35 consisting of an insulating film are formed at both side walls of the gate 34.

FIGS. 3B through 3E illustrate the formation of a silicide film. This is similar to the silicide formation shown in FIGS. 1B through 1E. That is, on the resulting structure of FIG. 3A, there is deposited a thin titanium film 36 and then, a primary heat treatment is carried out at 700° C., forming a titanium silicide film 37 having the $C_{49}$ phase at the interface between the titanium film 36 and the silicon substrate 31 as well as another titanium silicide film 38 at the interface between the gate 34 and the titanium film 36.

After non-reacted titanium film is completely removed with a $NH_4OH/H_2O_2$ solution, a secondary heat treatment process is carried out at high temperatures of not less than 800° C., so as to transform the titanium silicide films 37 and 38 having $C_{49}$ phase into titanium silicide films 37' and 38' having $C_{54}$ phase.

Thereafter, as shown in FIG. 3F, using a low acceleration energy of about 10 KeV, dopant ions having an opposite, conductive type from the substrate are implanted in the titanium silicide film 37'. For example, in a p type substrate (NMOS), $As^+$ ions are implanted. On the other hand, $BF^+$ ions are implanted in an n type substrate (PMOS).

Finally, as shown in FIG. 3G, a heat treatment process is carried out at about 1,000° C., so as to diffuse the dopants implanted in the titanium silicide film 37' into the substrate 31.

As a result, a source/drain region 39 of shallow junction is formed along with the silicide film, finishing the fabrication of a MOS transistor.

This SADS method requires that, just after the ion-implantation, the dopants are to be distributed only in the titanium silicide film. The common ion-implanting process can be carried out only with the acceleration energy of not less than 30 KeV. If the ion-implanting energy used is too large, the dopants comes to be distributed even into the silicon substrate. This results in increase of leak current caused by a knock-on effect on ion-implantation.

To prevent the leak current, an ion-implanting apparatus using a low acceleration energy of around 10 KeV is required to be employed. However, the use of the low acceleration energy is disadvantageous in views of throughput and safety. For example, in order to distribute the dopants only in the titanium silicide film by use of the low acceleration energy of around 10 KeV, the substrate must be subjected into pre-aomrphization by initially implanting dopants such as $Ge^+$ in the substrate.

In addition, since heat treatment is carried out twice to form the titanium silicide film in spite of the use of SADS method, there occur problems caused in the conventional method shown in FIG. 1.

SUMMARY OF THE INVENTION

Therefore, an object of the present invention is to solve the problems encountered in prior art methods and to provide a method for fabricating a MOS transistor having a thin silicide film and a source/drain region of shallow junction, capable of simplifying the fabrication processes and improving the characteristics of the device fabricated.

In accordance with the present invention, the above object can be accomplished by providing a method for fabricating a MOS transistor having a thin silicide film and a source/drain region of shallow junction, comprising the steps of: carrying a field oxidation process to form a device separation field oxide film on a predetermined portion of a silicon substrate; coating the substrate with an insulating film and a polysilicon film and patterning them to form a gate insulating film and a gate on a predetermined portion of the substrate, the other portion of the substrate being exposed; forming a spacer at respective side wall of the gate; depositing a thin titanium film and a thin titanium nitride film entirely over the resulting structure, in sequence; performing a rapid heat treatment process to form silicide films at the interface between the exposed substrate and the titanium film and at the interface between the gate and the titanium film and to form a $Ti_xO_yN_z$ film at the interface between the field oxide film and the titanium film and at the interface between the side wall spacer and the titanium film, remaining titanium film being transformed into titanium nitride film; implanting dopant ions having a conductive type opposite to the substrate in the titanium nitride film and the titanium silicide film; applying a heat treatment process to the titanium nitride film and the titanium silicide film including the dopants, to form a source/drain region of shallow junction in the substrate, the dopants being diffused into the substrate; and removing all remaining titanium nitride films and $Ti_xO_yN_z$ film except for the titanium silicide films.

BRIEF DESCRIPTION OF THE DRAWINGS

Other objects and aspects of the invention will become apparent from the following description of embodiments with reference to the accompanying drawings in which:

FIGS. 5A and 5B are curves showing the distribution of dopants implanted with an acceleration energy of 40 KeV during the fabrication of the MOS transistor according to the present invention.

DETAILED DESCRIPTION OF THE PREFERRED EMBODIMENTS

Figure 1A:
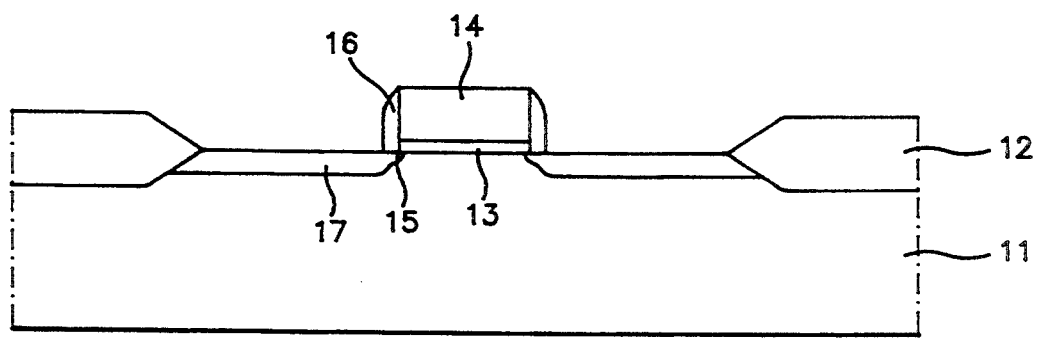
FIGS. 1A through 1E are schematic, cross-sectional views showing conventional fabrication processes for a MOS transistor having a thin silicide film and a source/drain region of shallow junction.
Figure 1B:
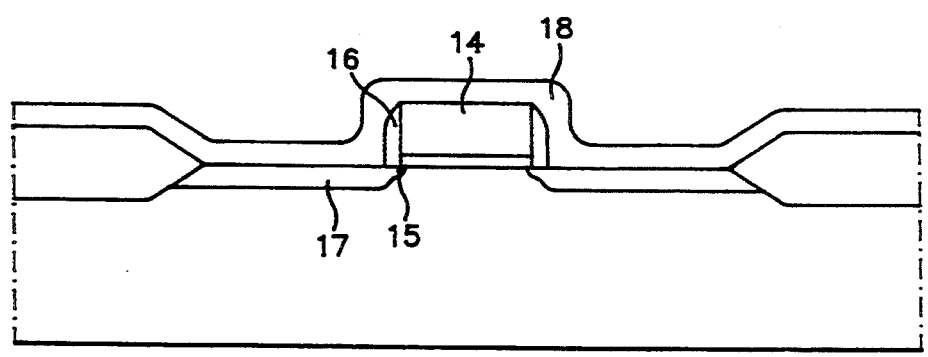
Figure 1C:
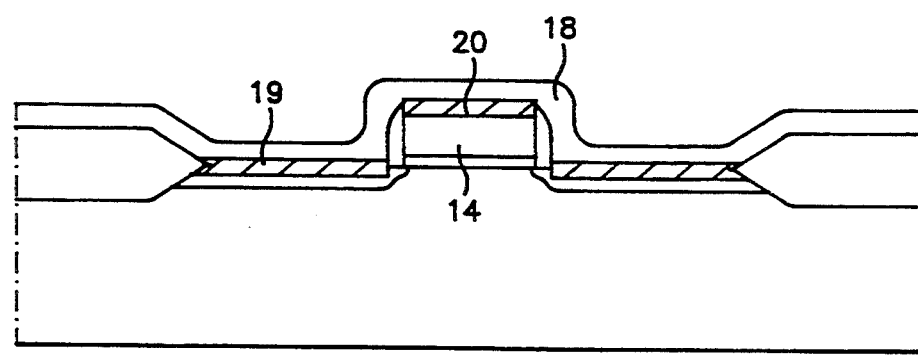
Figure 1D:
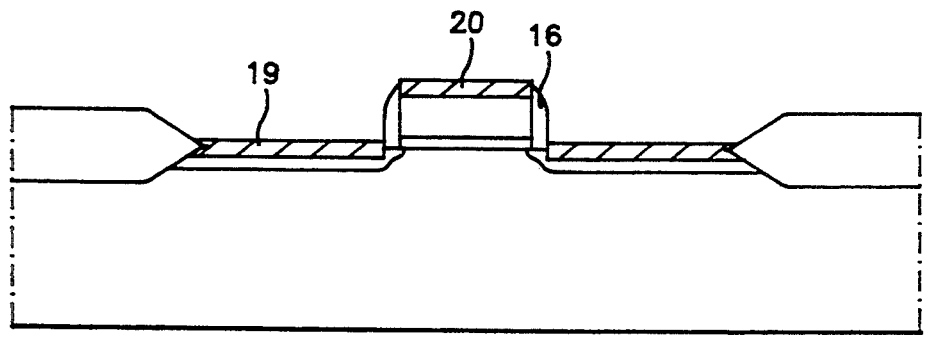
Figure 1E:
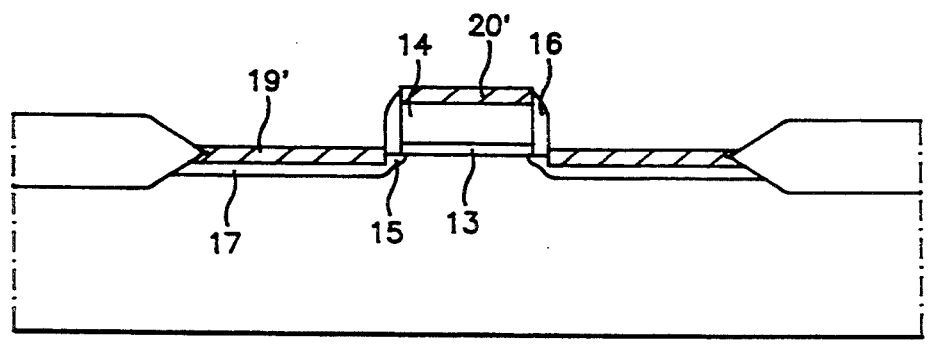
Figure 2:
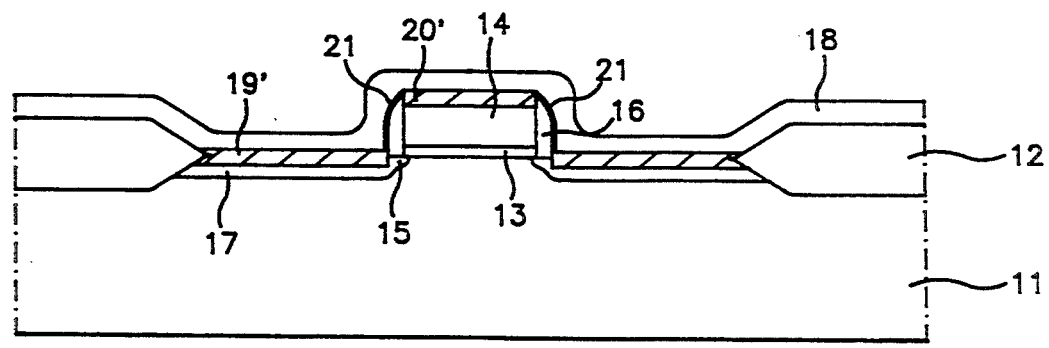
FIG. 2 is a schematic, cross-sectional view showing the formation of metal bridge caused by the conventional fabrication processes of FIG. 1.
Figure 3A:
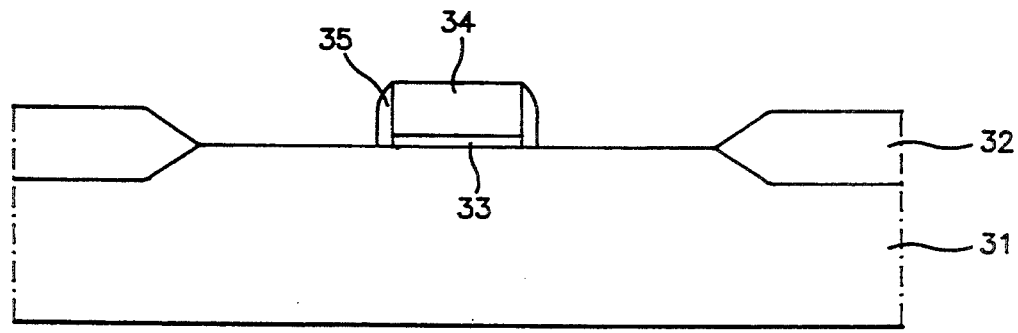
FIGS. 3A through 3G are schematic, cross-sectional views showing conventional fabrication processes for MOS transistor, employing a silicide as diffusion source (SADS) process.
Figure 3B:
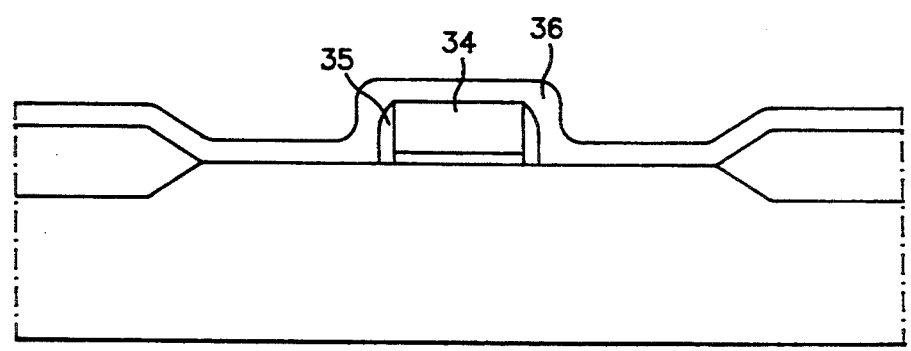
Figure 3C:
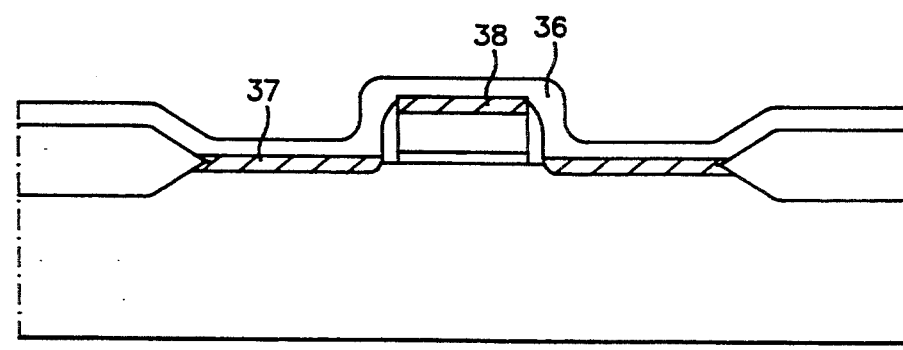
Figure 3D:
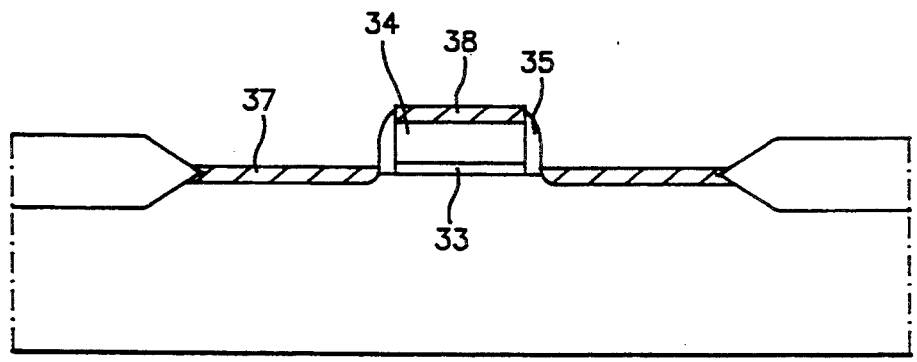
Figure 3E:
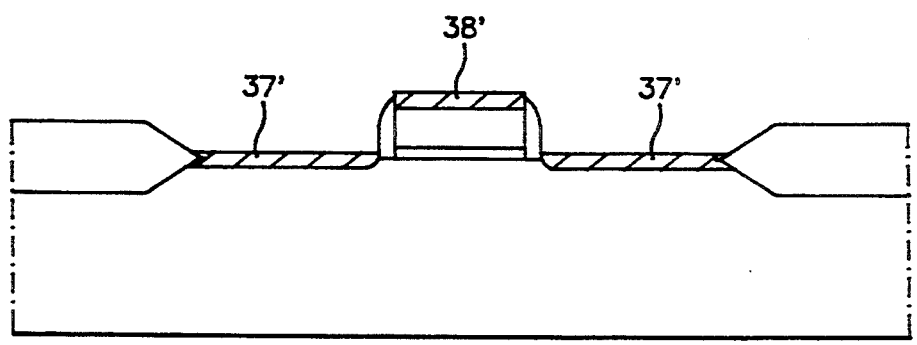
Figure 3F:
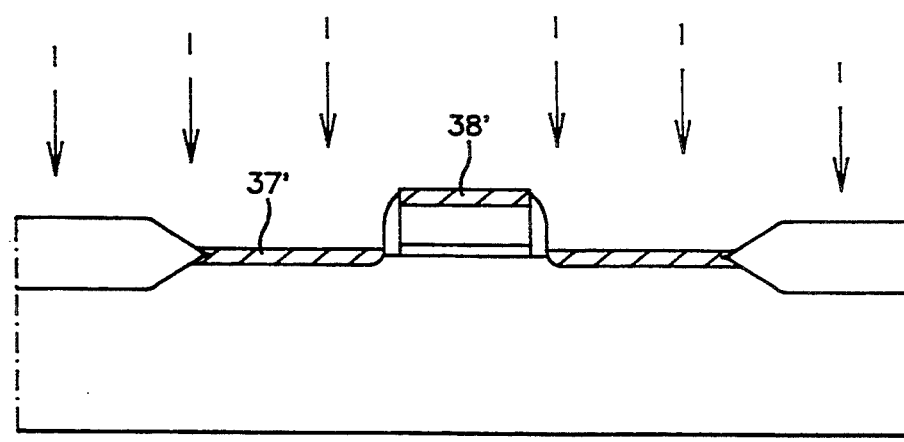
Figure 3G:
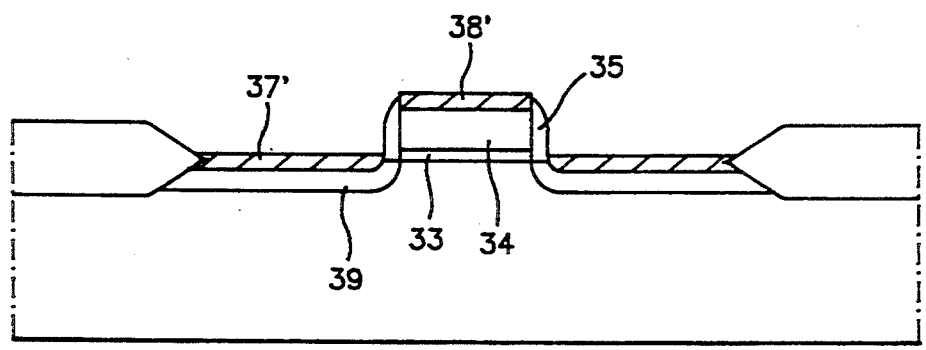

Hereinafter, the preferred embodiment of the present invention will be, in detail, described with reference to some drawings, wherein like reference numeral designate like parts, respectively.

Referring initially to FIGS. 4A through 4E, there is illustrated a method using a SADS process for fabricating a MOS transistor having a thin silicide and a source/drain region of shallow junction, according to the present invention.

Figure 4A:
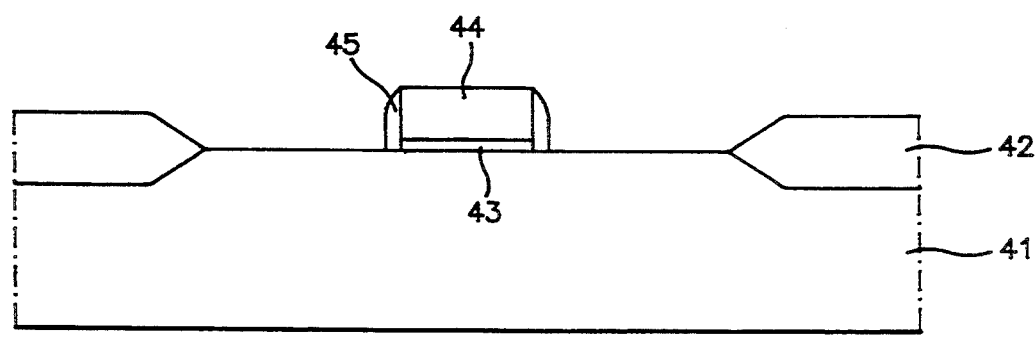
FIGS. 4A through 4E are schematic, cross-sectional views showing fabrication processes for MOS transistor, employing a SADS process, in accordance with the present invention.

First, as shown in FIG. 4A, a silicon substrate 41 is sectioned into a channel region and a device separation region by a field oxide film 42 formed with so-called LOCOS process, followed by the formation of a gate insulating film 43 and a gate of poly silicon film over the channel region, in due order. Then, a pair of spacers 45 consisting of an oxide film are formed at both side walls of the gate 43.

Figure 4B:
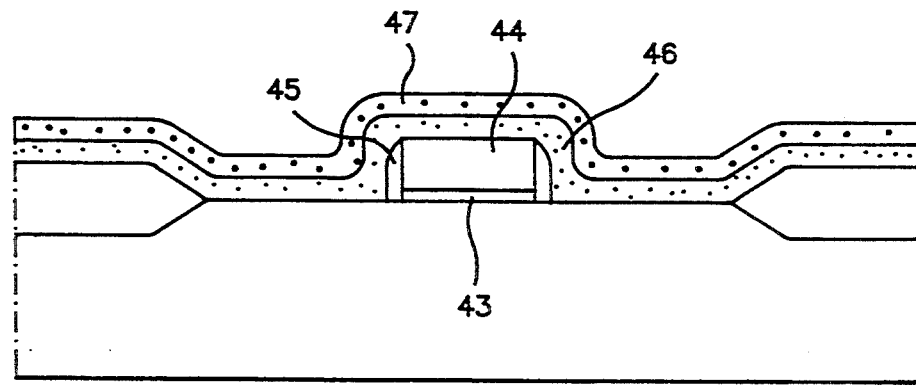

FIG. 4B illustrates the formation of a titanium film 46 and a titanium nitride (TiN) 47 which are approximately 200 Å thick, respectively. For this, on the resulting structure of FIG. 4A, they are entirely deposited, in sequence, without a void volume between them.

Figure 4C:
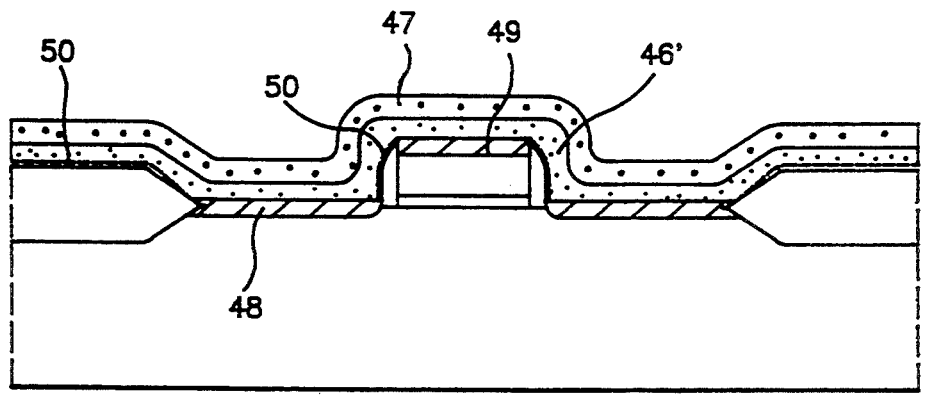

Next, as shown in FIG. 4C, a rapid heat treatment process is carried out at temperatures of not less than 800° C. for 20 seconds under an ammonia (NH₃) ambient. During the rapid heat treatment, a titanium silicide film 48 of C₅₄ phase, a SALICIDE film is formed at the interface between the substrate 41 and the titanium film 46, whereas a titanium silicide film 49 of C₅₄ phase, a polycide film is formed at the interface between the gate 44 and the titanium film 46.

During the formation of the C₅₄ phase films, a film consisting of $Ti_xO_yN_z$ is formed at the interfaces between the field oxide film 42 and the titanium film 46, and between the side wall spacer 45 of oxide film and the titanium film 46.

The titanium film results in the formation of the titanium silicide film which is 2.5 times thicker than the titanium film, so that the thin thickness of the early titanium film deposited is requisite to obtain the thin titanium silicide film.

However, as the titanium film is thinner, its thermal stability becomes more detrimental, which generates agglomeration.

For solving the above problems, the titanium nitride film 37 superior in thermal stability is formed over the titanium film 36, according to the present invention, thereby lowering the interface energy to obtain stable titanium silicide films 48 and 49. Moreover, the titanium nitride film 47 prevents the contamination of oxygen and the like of the heat treatment ambient, so as to obtain the stable titanium silicide films 48 and 49.

The mechanism of the formation of the titanium silicide films 48 and 49 which results from the reaction of the silicon substrate 41 and the titanium film 46 is given next. During the performance of the heat treatment under the ammonia ambient, nitrogen atoms go through the titanium nitride film 47 and into the titanium film 46, in which the nitrogen atoms react with titanium, transforming the titanium film 46 into the titanium nitride film 46'. At this time, the titanium nitride film is changed into the titanium silicide and into the $Ti_xO_yN_z$ film which results from the reactions with the silicon and the oxide film in virtue of the heat treatment, generating a phase separation phenomenon. As a result, the titanium silicide film 48, a SALICIDE film, is formed at the interface between the silicon substrate 41 and the titanium film 46, whereas the titanium silicide film 49, a polycide film, is formed at the interface between the gate 44 and the titanium film 46.

In addition, the $Ti_xO_yN_z$ film 50 is formed at the interface between the field oxide film 42 and the side wall spacers 45, because the oxidation energy of titanium is larger than that of silicon oxide film (SiO₂). That is, oxygen atom (O)/nitrogen atom (N) are solved in the titanium film 46 to form the $Ti_xO_yN_z$ film 50 which restrains the diffusion of silicon atoms (Si) from the substrate. By virtue of the function of the $Ti_xO_yN_z$ film 50, there are formed the titanium silicide films 48 and 49 only at the interfaces between the silicon substrate 41 and the titanium film 46, and between the gate 44 and the titanium film 46.

Owing to the solution of the nitrogen atoms (N), as shown in FIGS. 4B and 4C, the titanium film 46 is transformed into the titanium nitride 46', making the titanium silicide film 48 be thinner ultimately. For example, if the early thicknesses of the titanium 46 and the titanium nitride film 47 are 200 Å, respectively, the titanium silicide film 48 having a thickness of approximately 500 Å is ultimately formed after the heat treatment process.

Figure 4D:
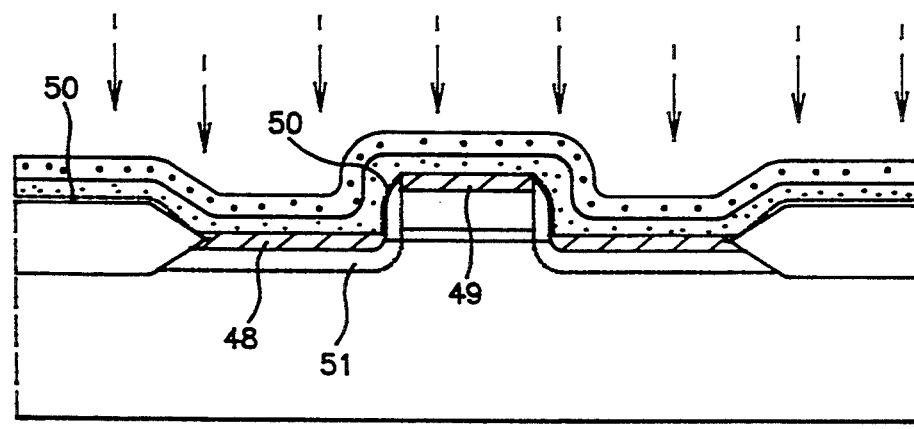

FIG. 4D illustrates the formation of a source/drain region 51 of shallow junction. For this, using a common ion-implanting apparatus, dopants having a conductive type opposite to the silicon substrate 41 are entirely implanted, as indicated by arrows, in the resulting structure, under an acceleration energy of not less than 30 KeV. At this time, since the apparent thicknesses of the titanium nitride film 47 and the titanium silicide film 48 are 700 Å, respectively, all the dopants implanted with the acceleration energy of not less than 30 KeV are present in the titanium nitride film 47 and the titanium silicide film 48. Thereafter, rapid heat treatment at around 1,000° C. diffuses the dopants implanted into the substrate 41, so as to form the source/drain region 51 of shallow junction.

Figure 4E:
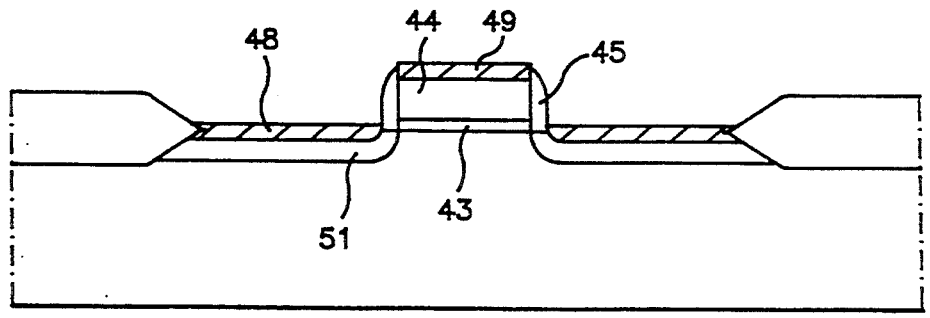

Finally, as shown in FIG. 4E, all remaining titanium nitride films 47 and 46' and $Ti_xO_yN_z$ film 50 but the titanium silicide films 48 and 49 are removed with a $NH_4OH/H_2O_2$ solution or other acid solutions, so as to give a MOS transistor having the thin silicide film and the source/drain region of shallow junction.

Referring now to FIG. 5, there are shown distribution curves of the dopants implanted with an acceleration energy of 40 KeV in the titanium nitride film 47 and the titanium silicide film 48 which are 200 Å and 500 Å thick, respectively. These curves are depicted by use of TRIM simulation. While FIG. 5A shows the case of the ion-implantation of $As^+$ (NMOS), FIG. 5B does $BF_2$ (PMOS).

As illustrated in FIGS. 5A and 5B, a suitable implantation condition can be selected in the acceleration energies of not less than 30 KeV, depending on the final thicknesses of the silicide film 46 and the titanium nitride film 47 obtained by varying the early thicknesses of them.

As described hereinbefore, the present method taking advantage of the phase separation of the titanium nitride is capable of forming the thin silicide film in once metal heat treatment process and thus, simplifying the processes as compared with the conventional method employing twice heat treatment.

In addition, the consumption of the source/drain region is minimized, so that a titanium silicide film suitable to shallow junction can be obtained, preventive of the increase of the contact resistance, in accordance with the present invention.

Further, the improvement of device characteristic are also attributed to the lack of the metal bridge, which results from the function of the phase separation phenomenon preventing the formation of the metal bridge in spite of the heat treatment of high temperature.

Furthermore, since the source/drain region is formed at an acceleration energy of not less than 30 KeV by employing a common ion-implanting apparatus, the present invention has significant advantages over the conventional methods, including the parasitic resistance such as the area resistance of the junction and the device characteristics.

Although the preferred embodiment of the present invention has been disclosed for illustrative purposes, those skilled in the art will appreciate that various modifications, additions and substitutions are possible, without departing from the scope and spirit of the present invention as disclosed in the accompanying claims.

What is claimed is:

1. A method for fabricating an MOS transistor having a source/drain region of shallow junction and a thin silicide film, comprising the steps of:
   conducting a field oxidation process to form a device separation field oxide film on a portion of a silicon substrate;
   coating said substrate with an insulating film and a polysilicon film and patterning them to form a gate insulating film and a gate on a portion of said substrate, the other portion of said substrate being exposed;
   forming a spacer at respective side wall of said gate;
   depositing a titanium film and thereafter a titanium nitride film over the entire resulting structure;
   performing a rapid heat treatment process under an ammonia ambient to form silicide films at the interface between said exposed substrate and said titanium film and at the interface between said gate and said titanium film and to form a $Ti_xO_yN_z$ at the interface between said field oxide film and said titanium film and at the interface between said side wall spacer and said titanium film, remaining titanium film being transformed into titanium nitride film;
   implanting dopant ions having a conductive type opposite to said substrate in said titanium nitride film and the titanium silicide film;
   applying a heat treatment process to said titanium nitride film and said titanium silicide film including said dopants, to form a source/drain region of shallow junction in said substrate, said dopants being diffused into said substrate; and
   removing all remaining titanium nitride films and $Ti_xO_yN_z$ film except for said titanium silicide films.

2. A method according to claim 1, wherein said titanium film and said titanium nitride film are deposited in sequence, leaving no void volume.

3. A method according to claim 1, wherein said rapid heat treatment process is carried out at a temperature of around 800° C.

4. A method according to claim 1, wherein said rapid heat treatment process is carried out at temperatures not less than 800° C. for twenty seconds.

5. A method according to claim 1, wherein said dopant ions are implanted with an ion-implanting apparatus at an acceleration energy of not less than 30 KeV.

6. A method according to claim 1, wherein said all remaining titanium nitride films and $Ti_xO_yN_z$ film except for said titanium silicide films are removed with one selected from the group consisting of a $NH_4OH/H_2O_2$ solution and others acid solutions.

7. A method according to claim 1, wherein said side wall spacer comprises oxide material.

8. A method according to claim 1, wherein said titanium silicide film is 2.5 times thicker than said titanium film.

9. A method according to claim 1, wherein said depositing step includes said titanium film and said titanium nitride film each being approximately 200 Å thick.

* * * * *